(12) United States Patent
Chen et al.

(10) Patent No.: US 6,452,464 B1
(45) Date of Patent: Sep. 17, 2002

(54) BACKGATE HETEROJUNCTION ACOUSTIC CHARGE TRANSPORT DEVICE

(75) Inventors: Chung-Hsu Chen, Torrance, CA (US); Daniel K. Ko, Monterey Park, CA (US); Edward M. Garber, Los Angeles, CA (US); Scott R. Olson, Long Beach, CA (US); Dwight Christopher Streit, Long Beach, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 07/920,411

(22) Filed: Jul. 27, 1992

(51) Int. Cl.[7] ............................................. H01L 41/08
(52) U.S. Cl. ..................... 333/155; 333/150; 333/194; 257/183; 257/245; 310/313 R
(58) Field of Search ................... 333/150, 155, 333/194; 257/183, 245; 310/313 R

(56) References Cited

U.S. PATENT DOCUMENTS

| | | | | |
|---|---|---|---|---|
| 4,748,485 A | * | 5/1988 | Vasudev | 333/155 |
| 4,893,161 A | * | 1/1990 | Tanski et al. | 333/194 |
| 4,926,083 A | * | 5/1990 | Merritt et al. | 310/313 R |
| 4,980,596 A | * | 12/1990 | Sacks et al. | 310/313 D |
| 4,990,814 A | * | 2/1991 | Tanski et al. | 310/313 R |
| 5,047,363 A | * | 9/1991 | Hickernell et al. | 437/53 |
| 5,256,582 A | * | 10/1993 | Mosher et al. | 437/31 |
| 5,309,004 A | * | 5/1994 | Grudkowski | 257/216 |

OTHER PUBLICATIONS

Sriram et al, Solid State Electronics (GB) vol. 28, #10, pp. 979–989, 10/85; abstract only herewith.*

* cited by examiner

Primary Examiner—Nelson Moskowitz
(74) Attorney, Agent, or Firm—Harness, Dickey & Pierce, P.L.C.

(57) ABSTRACT

An acoustic charge transport device is formed by a process which introduces a process dependent variation in charge carrier density within the device. The acoustic charge transport device includes a transport channel operable to carry charge carriers in response to a surface acoustic wave. In addition, the acoustic charge transport device further includes a backgate for controlling the charge carrier density within the transport channel.

20 Claims, 2 Drawing Sheets

BACKGATE HETEROJUNCTION ACOUSTIC CHARGE TRANSPORT DEVICE

BACKGROUND OF THE INVENTION

1. Technical Field

This invention relates to acoustic charge transport devices and more particularly to an acoustic charge transport device in which the charge carrier density in the transport channel can be controlled.

2. Discussion

Acoustic charge transport devices such as heterojunction acoustic charge transport devices are devices which are used to propagate charge carriers through a transport channel formed in a piezoelectric semiconductor substrate. Such acoustic charge transport devices generally include an input ohmic electrode for delivering charge carriers to an electropotential well established within the transport channel, as well as an output ohmic electrode for receiving charge carriers after they have propagated through the transport channel. Finally, such acoustic charge transport devices often include a surface acoustic wave transducer which is able to generate a surface acoustic wave and deliver the wave to the transport channel. The charge carriers which are in the electropotential well within the transport channel are then carried to the output ohmic contact in response to propagation of the surface acoustic wave through the transport channel.

Tight control of the transport channel's be precisely controlled charge carrier density is required for the acoustic charge transport devices so that the charge induced by the surface acoustic wave is sufficiently high as well as to maximize the signal-to-noise ratio. However, the charge carrier density is often a function of process-dependent as well as temperature dependent variations. With respect to process dependent variations, it will be noted that acoustic charge transport devices are often formed by molecular-beam epitaxy in which multiple molecular beams having different flux and chemistry are used in an ultrahigh-vacuum epitaxial growth process. If the doping or the thickness of the layers which form during this process are lower than certain particular ranges, the resulting charge carrier density within the transport channel is relatively small. As a result, a relatively high channel resistance is produced and a relatively small charge is induced in the transport channel by the surface acoustic wave. A similar result is obtained if the operating temperature of the acoustic charge transport device is lower than expected.

Furthermore, if the doping or the thickness of the layers of the acoustic charge transport device are greater than desired, the excess charge carriers will tend to accumulate within the electropotential well. This causes non-isolated wave packages to travel on the surface of the transport channel thereby producing a small signal-to-noise ratio. A similar result is obtained when operating temperatures are higher than expected.

SUMMARY OF THE INVENTION

In accordance with the teachings of the present invention, an acoustic charge transport device is provided. The acoustic charge transport device is formed by a process which introduces process dependent variations in charge carry density within the device. The acoustic charge transport device includes a transport channel which is operable to carry charge carriers in conjunction with the movement of a surface acoustic wave. In addition, the acoustic charge transport device includes means for controlling the charge carry density within the transport channel. By controlling the charge carrier density within the transport channel, the process dependent as well as temperature dependent variations in charge carry density within the acoustic charge transport device can be controlled.

BRIEF DESCRIPTION OF THE DRAWINGS

The various advantages of the present invention will become apparent to those skilled in the art by reading the following specification and by reference to the following drawings in which.

DETAILED DESCRIPTION OF THE PREFERRED EMBODIMENT

Figure 1:
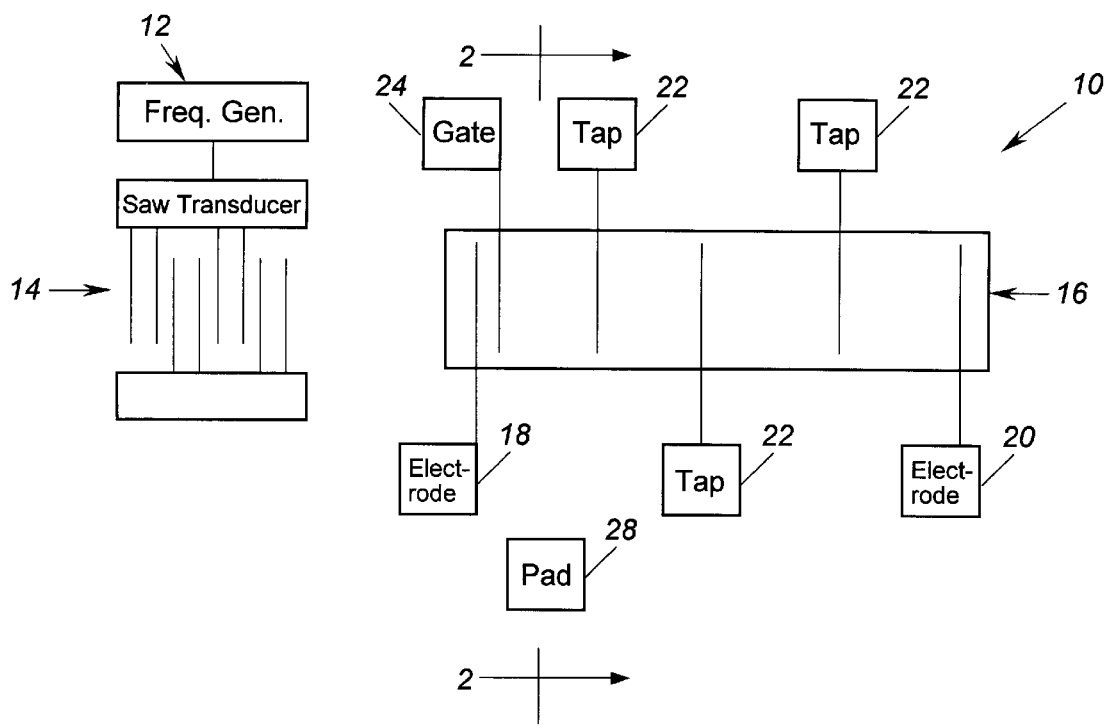
FIG. 1 is a diagrammatic illustration of the acoustic charge transport device according to the teachings of the first preferred embodiment of the present invention.

Turning now to FIG. 1, an acoustic charge transport device 10 is shown. The acoustic charge transport device 10 may typically be used as part of a programmable filter in which features such as bandwidth may be selectively controlled. The acoustic charge transport device 10 is preferably comprised of layers of group III–IV materials such as GaAs and AlGaAs which are both piezoelectric and semiconducting. In addition, acoustic charge transport 10 may typically be formed by molecular-beam epitaxy, though other suitable techniques may be used.

The acoustic charge transport device 10 comprises a frequency generator 12 and a surface acoustic wave transducer 14. The frequency generator 12 is operable to deliver a signal of a particular frequency to the surface acoustic wave transducer 14 in response to an input signal. Upon receipt of the signal from the frequency generator 12, the surface acoustic wave transducer 14 generates a responsive surface acoustic wave. The surface acoustic wave transducer 14 is formed in a known manner and preferably comprises an interdigitated transducer. In this regard, the bottom layer of the surface acoustic wave transducer 14 is formed by vapor deposition of a titanium layer, followed by a layer of platinum, another layer of titanium, and a layer of aluminum. Those skilled in the art will appreciate that oxygen implantation or mesa isolation is necessary to rendering the material under the surface acoustic wave transducer 14 semi-insulating. The input ohmic electrode 18 and the output ohmic electrode 20 are formed from an initial layer of nickel followed by layers of gold germanium, silver, and gold which are then subject to a rapid thermal annealing process.

To provide means for propagating charge carriers in response to the surface acoustic wave generated by the surface acoustic wave transducer 14, a transport channel 16 is provided. The transport channel 16 receives charge carriers from an input ohmic electrode 18 which are then trapped within the transport channel 16 by a electropotential well which is more completely described below. As surface acoustic waves pass through the transfer channel 16, the charge carriers which are in the electropotential well propagate through the transport channel 16 to an output ohmic electrode 20.

The acoustic charge transport device 10 further includes a Schottky gate 24 which is used to control current through the transport channel 16. The Schottky gate 24 is formed by initially vapor depositing a layer of titanium and a layer of gold followed by a gold plating process. The input signal to be filtered is applied to Schottky gate 24. The acoustic charge transport device 10 further includes a plurality of taps 22 which are capacitively coupled to the transport channel 16. The taps 22 are used to capacitively generate an output in response to the movement of charge carriers through the transport channel 16. The taps 22 are formed from an initial vapor deposited bottom layer of titanium followed by a layer of platinum, another layer of titanium, and a layer of aluminum. The output of the taps 22 are then further processed in a manner similar to a Fast Fourier Transform to generate a signal which is responsive to the input of the frequency generator 12.

As those skilled in the art will appreciate, proper operation of the acoustic charge transport device with only the components described above often depends on how precise the growth process was in forming the acoustic charge transport device. In this regard, if the growth process used in forming a particular acoustic charge transport device is such that the charge carrier density within the transport channel is relatively small, the resistance within the transport channel is relatively high so that the density of charge carriers induced by the surface acoustic wave is relatively small. Furthermore, if the growth process used to form a particular acoustic charge transport device is such that the charge carrier density is relatively high, non-isolated charge carrier packages tend to propagate on the surface of the transport channel thereby producing a relatively low signal-to-noise ratio. As a result, the process used to form the acoustic charge transport device had to be relatively stringently controlled so as to minimize the introduction of process dependent variations in charge carrier density.

In addition, the charge carrier density within acoustic charge transport devices is exponentially dependent on temperature. In this regard, an acoustic charge transport device with only the components described above which operated properly at one particular temperature may not function at substantially different temperatures. For this reason, the use of such acoustic charge transport devices is often limited to a particular temperature range.

To avoid these problems, the acoustic charge transport device of the present invention comprises a transport channel operable to carry charge carriers in response to a surface acoustic wave. The acoustic charge transport device further comprises means for controlling the charge carrier density within the transport channel whereby the variation in charge carrier density within the acoustic charge transport device can be controlled. By using the acoustic charge transport device of the present invention, temperature dependent as well as process dependent variations in charge carrier density can be controlled.

Figure 2:
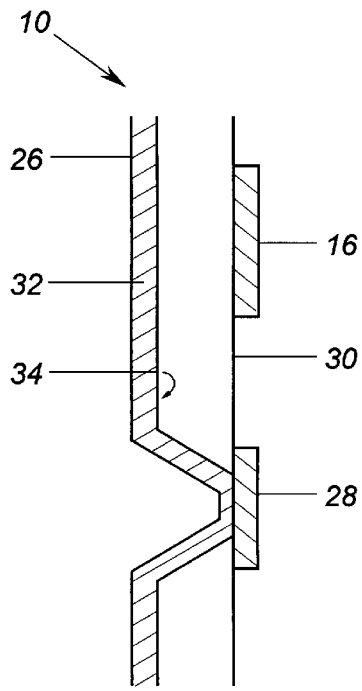
FIG. 2 is a diagrammatic cross-sectional illustration of the acoustic charge transport device according to the teachings of the first preferred embodiment of the present invention taken in the direction of line 2—2 in FIG. 1.

Again referring to FIGS. 1 and 2, the acoustic charge transport device 10 according to the first preferred embodiment of the present invention further comprises a backgate 26. The backgate 26 is used to control the potential along the length of the transport channel 16. The backgate 26 includes a pad 28 which is located on the first surface 30 of the acoustic charge transport device 10 as well as a metal layer 32 which is located on the second surface 34 of the acoustic charge transport device 10. The pad 28 is used to receive an electrical potential from a source (not shown) and deliver that potential to the metal layer 32 which is located below the transport channel 16. Accordingly, the application of an electrical potential to the metal layer 32 through the pad 28 can therefore either raise or lower the electropotential well in the manner described below. By raising and lowering the electropotential well, the application of a potential to the pad 28 can control both process dependent variations as well as temperature dependent variations in charge carrier density within the acoustic charge transfer device 10.

Figure 3:
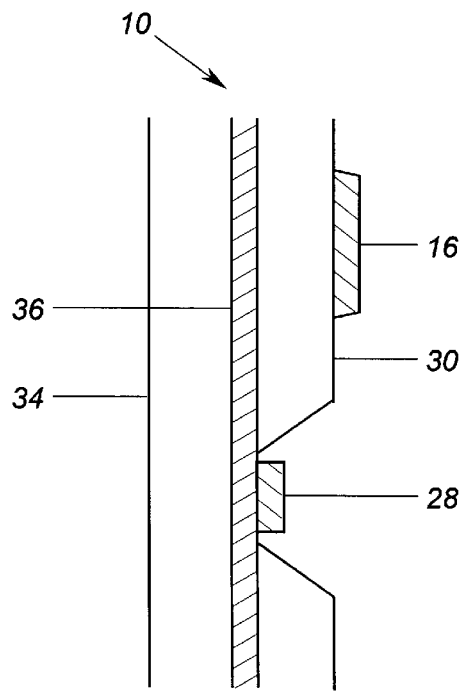
FIG. 3 is a diagrammatic illustration of the acoustic charge transport device according to the teachings of the second preferred embodiment of the present invention.

The second preferred embodiment of the present invention will now be described with reference to FIG. 3. The elements of FIG. 3 which correspond to the elements of FIG. 2 have been given the same reference numerals. However, the backgate 26 according to the second preferred embodiment is formed by a buried P-layer 36 which is located between the first surface 30 and the second surface 34 of the acoustic charge transfer device 10. The buried P-layer 36 electrically communicates with the pad 28 so that the application of a voltage to the pad 28 causes the buried P-layer 36 to exert a potential on the transport channel 16. Accordingly, the depth of the electropotential well within the transport channel 16 can be varied by controlling the voltage applied to the pad 28 and therefore to the buried P-layer 36.

The various layers forming the acoustic charge transport device 10 will now be described with reference to FIGS. 4A–C. The acoustic charge transport device 10 includes a semi-insulated GaAs substrate 38 upon which a metal layer 32 is formed. The metal layer 32 is formed by first vapor depositing a layer of titanium and a layer of gold followed by a gold plating process, and serves to create the backgate 26 as described above. The thickness of the GaAs substrate 38 is 100 um, though it is understood that other thickness can be used.

Deposited on the GaAs substrate 38 is an unintentionally doped first layer 39 of AlGaAs which preferably has a thickness of 1000 angstroms. Grown on the upper surface of the first AlGaAs layer 39 is a first GaAs layer 40 which is where the electropotential well 46 is located. The first GaAs layer 40 is unintentionally doped and preferably has a thickness of approximately 400 angstroms. A second layer 42 of AlGaAs is then formed on the upper surface of the first GaAs layer 40. The second AlGaAs layer 42 has a doping density of $2.3 \times 10^{17}$ cm$^3$ and has a thickness of approximately 700 angstroms. Finally, a cap layer 44 of GaAs is formed on the upper surface of the second AlGaAs layer 42. The cap layer 44 is unintentionally doped and has a thickness of approximately 200 angstroms.

Figure 4:
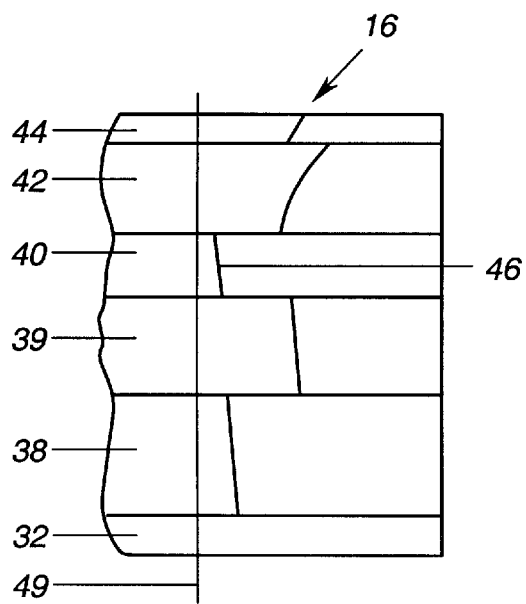
FIGS. 4(a)–4(c) are diagrammatic illustrations showing conduction band potentials across several material layers of the acoustic charge transport device shown in FIG. 1.
Figure 4:
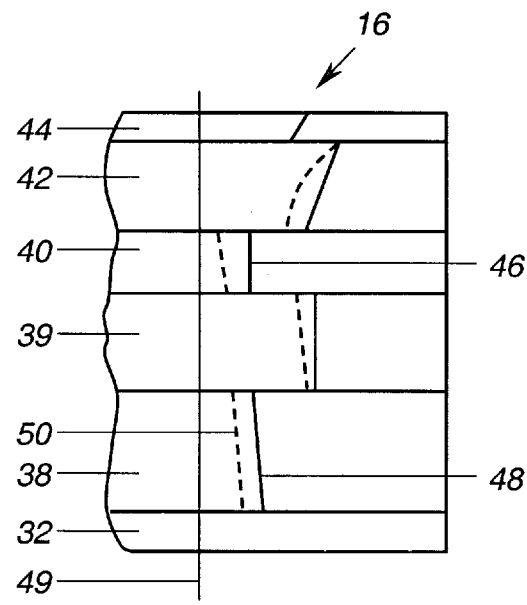
Figure 4:
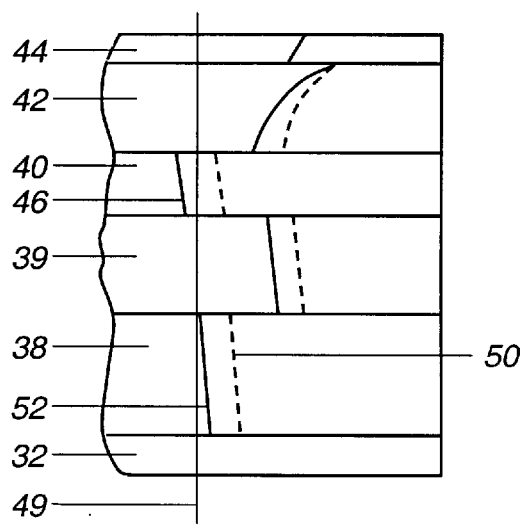

As illustrated by the conduction band potential associated with the first preferred embodiment shown in FIG. 4(A), a electropotential well 46 is created in the transport channel 16 which serves to store the charge carriers after being delivered to the transport channel 16 by the input ohmic electrode 18. The thickness and doping of the second AlGaAs layer 42 is designed to provide a minimum number of electrons to fill the surface states within the second AlGaAs layer 42 while leaving the remainder of the structure essentially free from excess carriers.

The operation of the backgate 26 as it is used to eliminate process dependent and temperature dependent variations will now be described. With respect to FIG. 4(B), the line 48 illustrates the conduction band potential in a situation where the process used for forming the acoustic charge transport device 10 is such that the doping or thickness is less than specified or when the operating temperature is lower than expected. This is shown by the fact that the line 48 indicates that the conduction band potential with respect to the fermi energy level (indicated by the line 49) is greater than that associated with the line 50 which indicates the conduction band potential if the desired doping, thickness and operating temperature were present. In this case, the resistance within the transport channel 16 is sufficiently high so that the movement of charge carriers induced by the surface acoustic wave will be relatively small. In such circumstances, a positive voltage may be applied to the backgate 26 so as to deepen the electropotential well so as to increase charge density. Accordingly, the application of the positive voltage to the backgate 26 will compensate for the impact of having a reduced doping or thickness of the transport channel 16 or compensate for operating temperatures which are lower than that for which the acoustic charge transport device 10 is designed.

FIG. 4(C) illustrates the situation in which the doping or thickness of the transport channel 16 is larger than desired or where the operating temperature is higher than expected. In this case, the electropotential well 46 within the transport channel 16 is deeper than desired. This is illustrated by the fact that the conduction band potential illustrated by the line 52 is lower than in the case when the doping, thickness and operating temperature are in the desired ranges as indicated by the line 50. Because the conduction band potential is lower than desired, the resulting signal-to-noise ratio is lower than expected. To reduce the adverse impact these temperature dependent and process dependent variations have on the signal-to-noise ratio, a negative voltage may be applied to the backgate 26. The application of a negative potential to the backgate 26 reduces the number of charge carriers collected within the electropotential well effectively changing the conduction band potential from that which is represented by line 52 to that which represented by the line 50. This change in the conduction band potential increases the signal-to-noise ratio.

While this invention has been disclosed herein in connection with a particular example thereof, no limitation is intended thereby except as defined by the following claims. This is because the skilled practitioner will recognize that other modifications can be made without departing from the spirit of this invention after studying the specification and drawings.

What is claimed is:

1. A heterojunction acoustic charge transport device being formed by a process which introduces a process dependent variation in charge carrier density within said acoustic charge transport device, said acoustic charge transport device comprising:

a transport channel operable to carry charge carriers in response to a surface acoustic wave; and means for controlling the charge carrier density within said transport channel, whereby said process dependent variation in charge carrier density within said acoustic charge transport device can be controlled.

2. The acoustic charge transport device of claim 1, wherein said means for controlling the charge carrier density within said transport channel includes a backgate.

3. The acoustic charge transport device of claim 1, wherein said means for controlling the charge carrier density within said transport channel includes means for generating an electrical potential along the length of said transport channel.

4. The acoustic charge transport device of claim 3, wherein said acoustic charge transport device has first and second surfaces with said transport channel being disposed on said first surface, said means for controlling the charge carrier density within said transport layer includes a layer of metallic material disposed on said second surface, said layer of metallic material electrically being operable to induce a potential on said transport channel in response to a voltage delivered to said layer of metallic material.

5. The acoustic charge transport device of claim 3, wherein said means for generating a potential on said transport channel includes a doped layer of semiconductor material being operable to induce an electrical potential on said transport channel in response to a voltage delivered to said doped layer of semiconductor material.

6. The acoustic charge transport device of claim 1, wherein said charge carrier density within said transport channel is further responsive to changes in the temperature of said acoustic charge transport device, said means for controlling the charge carrier density within said transport channel being further operable to reduce variation in charge carrier density within said acoustic charge transport device due to temperature changes.

7. The acoustic charge transport device of claim 1, wherein said means for controlling the charge carrier density is further operable to change the conduction band potential in said transport channel.

8. A heterojunction acoustic charge transport device susceptible to a temperature dependent variation in charge carrier density, said acoustic charge transport device having first and second surfaces, said acoustic charge transport device comprising:

a transport channel operable to carry charge carriers in response to a surface acoustic wave, said transport channel formed proximate to said first surface of said acoustic charge transport device; and a backgate disposed proximate to said second surface of said acoustic charge transport device, whereby said temperature dependent variation in charge carrier density within said acoustic charge transport device can be controlled.

9. The acoustic charge transport device of claim 8, wherein said backgate includes means for generating an electrical potential in said transport channel.

10. The acoustic charge transport device of claim 9, wherein said means for generating an electrical potential includes a layer of metallic material disposed proximate to said second surface of said acoustic charge transport device, said layer of metallic material being operable to induce a potential on said transport channel in response to the voltage delivered to said layer of metallic material.

11. The acoustic charge transport device of claim 10, wherein said means for generating an electrical potential further includes a pad which electrically communicates with said layer of metallic material, said pad being disposed proximate to said first surface of said acoustic charge transport device.

12. The acoustic charge transport device of claim 8, wherein said backgate includes a doped layer of semiconductor material being operable to induce an electrical potential on said transport channel in response to the voltage delivered to said doped layer of semiconductor material.

13. The acoustic charge transport device of claim 8, wherein said charge carrier density within said acoustic charge transport device is further susceptible to process dependent variation, said means for controlling the charge carrier density within said transport channel being further operable to reduce process dependent variation in said charge carrier density in said acoustic charge transport device.

14. A method for reducing process dependent variation in the charge carrier density of a heretojunction acoustic charge transport device, said acoustic charge transport device including a transport channel, said method comprising the steps of:

locating a backgate within said acoustic charge transport device proximate to said heretojunction transport channel, applying a voltage to said backgate; and controlling the voltage on said backgate so as to reduce process dependent variation in said charge carrier density in said heretojunction acoustic charge transport device.

15. The method of claim 14, further comprising the step of changing the conduction band potential of said acoustic charge transport device in response to the voltage applied to said backgate.

16. The method set forth in claim 14, wherein step of locating a backgate within said acoustic charge transport device includes the step of depositing a metal layer on said acoustic charge transport device proximate to said transport channel.

17. The method of claim 14, wherein acoustic charge transport device includes first and second surfaces, said backgate includes a metal layer disposed on said first surface of said acoustic charge transport device and a pad located on said second surface of said acoustic charge transport device.

18. The method set forth in claim 14, wherein said step of locating a backgate within said acoustic charge transport device includes the step of forming a doped layer of semiconductive material below said transport channel.

19. The method set forth in claim 14 wherein charge carrier density is further responsive to temperature variation, said method further comprising the additional step of controlling the voltage of said backgate to reduce variation in charge carrier density caused by said temperature variation.

20. The method set forth in claim 14, wherein said acoustic charge transport device is susceptible to process dependent variations in charge carrier density, said method further comprising the additional step of controlling the voltage on said backgate to reduce process dependent variations in said charge carrier density.

* * * * *